United States Patent [19]

Scardera et al.

[11] Patent Number: 4,863,563
[45] Date of Patent: Sep. 5, 1989

[54] ETCHING SOLUTIONS CONTAINING AMMONIUM FLUORIDE AND A NONIONIC ALKYL AMINE GLYCIDOL ADDUCT AND METHOD OF ETCHING

[75] Inventors: Michael Scardera, Hamden; Thomas S. Roche, Cheshire, both of Conn.

[73] Assignee: Olin Corporation, Cheshire, Conn.

[21] Appl. No.: 194,256

[22] Filed: May 16, 1988

Related U.S. Application Data

[63] Continuation-in-part of Ser. No. 7,067, Jan. 27, 1987, Pat. No. 4,761,245.

[51] Int. Cl.$^4$ .............................................. C09K 13/08
[52] U.S. Cl. ................................... 156/662; 156/657; 252/79.3
[58] Field of Search ........................... 252/79.3, 79.4; 156/657, 662

[56] References Cited

U.S. PATENT DOCUMENTS

| | | |
|---|---|---|
| 2,089,569 | 8/1937 | Orthner et al. |
| 3,181,984 | 5/1965 | Tillis .................... 252/79.3 |
| 3,992,235 | 11/1976 | Garbarini ............. 252/79.3 |
| 4,517,106 | 5/1985 | Hopkins et al. ..... 252/79.4 |
| 4,582,624 | 4/1986 | Enjo et al. ........... 252/79.4 |
| 4,620,934 | 9/1986 | Hopkins et al. ..... 252/79.4 |
| 4,761,245 | 8/1988 | Scardera et al. |

FOREIGN PATENT DOCUMENTS

| | | |
|---|---|---|
| 0115583 | 8/1984 | European Pat. Off. ........... 252/79.3 |
| 2393840 | 2/1979 | France. |
| 58-53980 | 3/1983 | Japan. |
| 0773063 | 10/1980 | U.S.S.R. ............................ 252/79.3 |

OTHER PUBLICATIONS

Fluorad, Fluorochemical Surfactants, a Product Info. Bulletin by 3M, 1982.
Olin Chemical Specialties, Product Data Sheet, *Glycidol Surfactant 10G Specialty Nonionic Surfactant*, 1979.

*Primary Examiner*—David L. Lacey
*Assistant Examiner*—L. Johnson
*Attorney, Agent, or Firm*—James B. Haglind

[57] ABSTRACT

Etching solutions used to etch, for example, silicon dioxide coated substrates in the manufacture of integrated circuits comprise an aqueous solution of ammonium fluoride and a wetting amount of a nonionic alkyl amine glycidol adduct. Preferred embodiments of the nonionic alkyl amine glycidol adducts employed in the etching solution of the present invention are those represented by the formulas:

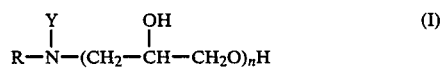

(I)

wherein
R represents an alkyl group having from about 8 to about 18 carbon atoms and mixtures thereof,
Y represents H,

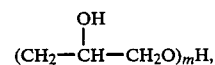

or mixtures thereof;
n is from about 1 to about 20; and
m+n are from about 2 to about 20; or

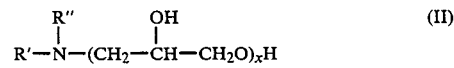 (II)

wherein
R' and R" represent independently selected alkyl groups, the sum total of carbon atoms in R'+R" being from about 8 to about 18; and
X is from 1 to about 20.

The etching solutions preferably contain hydrogen fluoride in a volume ratio of NH$_4$F to HF to from about 3:1 to about 50:1. The novel etching solutions of the present invention have excellent wetting characteristics and retain their wetting properties after extended periods of continuous filtration through sub-micron filters.

29 Claims, No Drawings

ETCHING SOLUTIONS CONTAINING AMMONIUM FLUORIDE AND A NONIONIC ALKYL AMINE GLYCIDOL ADDUCT AND METHOD OF ETCHING

This application is a continuation-in-part of U.S. Ser. No. 007,067, now U.S. Pat. No. 4,761,245 filed Jan. 27, 1987.

This invention relates to etching solutions used in the manufacture of integrated circuits. More particularly this invention relates to etching solutions containing wetting agents to properly wet substrates of components in the manufacture of integrated circuits.

As integrated circuit component dimensions decrease, physical wetting by etchant solutions on substrate surfaces becomes more difficult. This is particularly significant for buffered oxide etchants i.e., ammonium fluoride/hydrofluoric acid solutions used in silicon dioxide etching as these solutions exhibit extremely high surface tension values at typical etching temperatures. Because of the relatively low surface energies of the masking materials used and the photoresist topography, it is difficult to properly wet the substrate, which results in non-uniform etching and poor line reproduction.

While pretreatment ("predipping") of the component into a surfactant solution before placing the substrates in the etching solution is known, more satisfactory results are obtained by the addition of the wetting agent to the etching solution. However, most surfactants commonly used in the industry are insoluble in buffered oxide etchant solutions containing ammonium fluoride and hydrofluoric acid. Further, sufficient amounts of the wetting agent must remain in the etching solution after filtration through filters on the order of substrates during the etching process.

Wetting agents containing fluorochemical compounds have been employed as additives to $NH_4F/HF$ etching solutions to improve wetting properties. Examples of fluorochemical compounds include perfluorinated alkyl sulfonates described in U.S. Pat. No. 4,517,106, issued May 14, 1985, and fluorinated cycloalkane and cycloalkene sulfonates taught in U.S. Pat. No. 4,620,934, issued Nov. 4, 1986 to R. J. Hopkins et al; fluorine-containing carboxylic acids described in U.S. Pat. No. 4,582,624, issued Apr. 15, 1986 to N. Enjo et al; and fluorine-containing diamine compounds as described in Japanese Patent Kokai Publication No. 53,980/1983 published Mar. 30, 1983 by Daikin Kogyo KK. Some of these wetting agents are readily removed through filtration through sub-micron filters; others have low solubility in the etching solutions; and in addition, these fluorochemical compounds are expensive to use.

There is a need for wetting agents which are readily soluble in buffered etching solutions containing ammonium fluoride to provide etching solutions which can be used to etch components having large and small geometries and which retain their solubility and wetting characteristics after repeated filtrations through sub-micron filters.

It is an object of the present invention to provide etching solutions for use in integrated circuit manufacture having excellent wetting characteristics and which will not incorporate metallic ions.

Another object of the present invention is to provide buffered etching solutions containing ammonium fluoride and hydrogen fluoride having excellent wetting characteristics which are retained after filtration for extended periods of time through sub-micron filters.

A further object of the present invention is to provide a process for etching silicon dioxide substrates having desirable etching rates.

These and additional objects of the present invention are accomplished in an etching solution comprising an aqueous solution of ammonium fluoride and a wetting amount of a nonionic alkyl amine glycidol adduct.

In more detail, the alkyl amine glycidol adducts which are useful as wetting agents in the etching solutions of the present invention include those having a primary or secondary alkyl amine group and any suitable number of glycidol groups. Suitable alkyl amines include those sold commercially as coco amines, soya amines, and tallow amines or mixed fatty amines.

Preferred embodiments of the nonionic alkyl amine glycidol adducts employed in the eching solution of the present invention are those represented by the formulas:

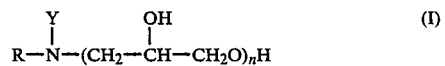
(I)

wherein
R represents an alkyl group having from about 8 to about 18 carbon atoms and mixtures thereof,
Y represents H,

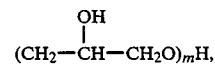

or mixtures thereof;
n is from about 1 to about 20; and
m+n are from about 2 to about 20; or

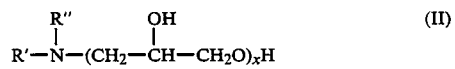
(II)

wherein
R' and R" represent independently selected alkyl groups, the sum total of carbon atoms in R'+R" being from about 8 to about 18; and
x is from 1 to about 20.

Amine glycidol adducts represented by the above formulas include those of Formula I in which R represents as alkyl groups, for example, octyl, nonyl, decyl, hendecyl, dodecyl or coco or lauryl, tetradecyl, pentadecyl, hexadecyl, heptadecyl, octadecyl or stearyl or tallow or soya, and mixtures thereof. The adducts are generally a mixture in which Y represents both H and the glycidol group and the amine is therefore a mixture of secondary and tertiary amine mixture. Preferred embodiments of the amine glycidol adducts represented by Formula I are those in which Y represents

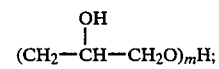

and m+N are from about 2 to about 16.

Amine glycidol adducts represented by Formula II include those, for example, in which R' represents butyl, hexyl, octyl, nonyl, decyl or coco, hendecyl, dodecyl or lauryl or coco, tetradecyl, pentadecyl, hexadecyl, or heptadecyl, and R"- represents, for example, methyl, ethyl, butyl, hexyl, or octyl.

x in Formula II is preferably from about 2 to about 16.

More preferred embodiments of the amine glycidol adducts include those in which R represents an alkyl group having from about 12 to about 16 carbon atoms and mixtures thereof; and m+n are from about 2 to about 10. It is noted that the m, n or x represent an average number of glycidol units per alkyl amine unit. The amine glycidol adducts used as wetting agents can be prepared, for example, by the method described in U.S. Pat. No. 2,089,569, published Aug. 10, 1937 by L. Orthner and C. Heuck.

These liquid nonionic wetting agents are employed in any suitable amounts which, in the buffered oxide etching solutions, will enhance the wetting of the substrate to be etched. Suitable wetting amounts include those in the range of from about 5 to about 50,000 parts per million by weight, preferably from about 25 to about 30,000, and more preferably from about 50 to about 5,000 parts per million.

The novel etching solutions of the present invention, as buffered oxide etchants, are aqueous solutions of ammonium fluoride having a concentration of between about 15 percent and about 40 percent by weight of $NH_4F$. Admixed with the ammonium fluoride is an aqueous solution of hydrogen fluoride in amounts which provide the buffered oxide etchant with at least about 3 parts by volume of $NH_4F$ to about 1 part by volume of HF and up to about 100 parts by volume of $NH_4F$ to about 1 part by volume of HF. In preparing the buffered oxide etching solutions of the present invention, commercially available concentrated aqueous solutions of $NH_4F$ (normally about 40 percent by weight) and HF (normally about 49 percent by weight) may be employed.

Other acids could be used in place of hydrogen fluoride in the ammonium fluoride etching solutions of the present invention including, for example, hydrogen chloride acetic acid, nitric acid, fluoboric acid, and the like.

The novel etching solution of the present invention may be prepared in any suitable manner. For example, an aqueous solution of ammonium fluoride and the wetting agent may be prepared and the hydrogen fluoride then added; the aqueous solutions of ammonium fluoride and hydrogen fluoride and the nonionic wetting agent may be simultaneously blended or the aqueous mixture of ammonium fluoride and hydrogen fluoride prepared and the wetting agent then blended in.

The novel etching solutions of the present invention all retain their wetting properties after 0.2 micron filtration, even under continuous filtration conditions. Moreover, the etching solutions after filtering have the property of wetting substrates more effectively and yield more uniform results by etching small geometries (1 to 5 microns) and large geometries (>5 micron) of silicon dioxide in a patterned resist at the same rate without additional deleterious effects. Further, the nonionic wetting agents do not incorporate metallic ions in their structure.

Other additives normally used in buffered oxide etchant solutions may be included in the novel etching solutions of the present invention. For example, polar solvent diluents such as acetic acid, ethylene glycols, glycerol, and lower alkyl alcohols having from 1 to about 4 carbon atoms may be included.

The etching solutions are used to etch silicon dioxide coated substrates in the manufacture of integrated circuits employing methods and procedures known in the semiconductor industry.

The novel etching solutions of the present invention provide etchant solutions with reduced surface tensions after microfiltration which improves substrate wetting and yields superior etchant performance resulting in cleaner surfaces and greater uniformity of etched profiles without incorporating foreign metallic ions. The solutions are stable and have desirable shelf lives without phase separations of the wetting agent from the $NH_4F$ and HF components.

The following examples illustrate the present invention with no intention of being limited thereby.

EXAMPLE 1

Preparation of Hexadecylamine Glycidol (5) Adduct

Into a reactor fitted with a dropping funnel, a $N_2$ gas inlet, a stirrer, a thermometer, a condenser, and a gas vent, was placed 36 g (0.15 mole) of hexadecylamine. Under a nitrogen atmosphere, glycidol (55.5 g, 0.75 mole) was added dropwise to the hexadecylamine at 150° to 160° C. Upon completion of the addition, the reaction mixture was stirred at 150° to 160° C. for an additional 45 minutes. The reaction mixture was cooled and the product removed from the flask. The product, identified as a hexadecylamine adduct with 5 moles of glycidol, weighed 91 grams.

EXAMPLE 2

Using the process of EXAMPLE 1, the hexadecylamine adduct with 12 moles of glycidol was prepared.

EXAMPLE 3

Preparation of Cocoamine Glycidol (3) Adduct

Into a reactor of the type used in EXAMPLE 1 was placed 92.5 g (0.5 m) of cocoamine*. Under a nitrogen atmosphere, glycidol (111 g, 1.5 m) was added dropwise to the cocoamine at 150° to 170° C. After complete addition of the glycidol and post-reaction, 101.75 g of a product was removed and identified as an adduct of cocoamine and 3 m of glycidol.

(*Armeen C, a product of Akzo Chemie America.)

EXAMPLE 4

To 101.25 g (0.25 m of the 3:1 adduct) of the reaction mixture remaining in the reactor of EXAMPLE 3 was added 37 g (0.5 m) of glycidol dropwise at 160° C. Upon completion of the glycidol addition and post-reaction, this product was cooled to room temperature. The product weighed 138.2 g and was identified as an adduct of cocoamine with 6 moles of glycidol.

EXAMPLES 5-6

Using the process of EXAMPLES 3 and 4, the cocoamine adducts with 2 moles of glycidol and with 5 moles of glycidol were prepared.

EXAMPLE 7

Using the process of EXAMPLE 1, dodecylamine (Armeen 12D, a product of Akzo Chemie America) was reacted with glycidol to produce the dodecylamine adduct of 6 moles of glycidol.

EXAMPLE 8

A buffered oxide etching aqueous solution was prepared containing 7 parts by volume of 40 percent ammonium fluoride and 1 part by volume of 49 percent hydrogen fluoride. To 800 mls of the etching solution was added 250 parts per million of the hexadecylamine glycidol (5) adduct prepared in EXAMPLE 1.

The surface tension of the etching solution was measured with a Du Nouy Ring Tensiometer at 25° C. The solution was continuously filtered through a 0.2 micron polytetrafluoroethylene filter (Millipore) at a rate of 800 mls/min for 5 to 5½ hours and the surface tension measured again. The results are shown in TABLE I below.

EXAMPLES 9-12

The procedure of Examples 8 was repeated exactly with the substitution for the hexadecylamine glycidol (5) adduct of the following wetting agents

| EXAMPLE 9 | Hexadecylamine Glycidol (12) Adduct | (prepared in EXAMPLE 2) |
| EXAMPLE 10 | Cocoamine Glycidol (2) Adduct | (prepared in EXAMPLE 5) |
| EXAMPLE 11 | Cocoamine Glycidol (5) Adduct | (prepared in EXAMPLE 6) |
| EXAMPLE 12 | Dodecylamine Glycidol (6) Adduct | (prepared in EXAMPLE 7) |

The results are given in TABLE I below.

TABLE I

| | | Surface Tension (dynes/cm) | |
|---|---|---|---|
| Example No. | Wetting Agent | Before Filtration | After Filtration |
| 8 | Hexadecylamine Glycidol (5) Adduct | 39.2 | 40.7 |
| 9 | Hexadecylamine Glycidol (12) Adduct | 39.4 | 44.0 |
| 10 | Cocoamine Glycidol (2) Adduct | 34.2 | 36.5 |
| 11 | Cocoamine Glycidol (5) Adduct | 37.5 | 40.5 |
| 12 | Dodecylamine Glycidol (6) Adduct | 38.0 | 37.8 |

TABLE I shows that the etching solutions of EXAMPLES 8-12 of the present invention have only a small loss in wetting activity after continuous filtration over an extended period of time.

EXAMPLES 13-14

Four inch silicon wafers were oxidized thermally to about 6000 A, (determined by ellipsometry) coated with positive photoresist to a thickness of about 1.2 microns, and patterned with masks having geometries of about 1.6, about 1.8 and about 2 microns. The etch time was then calculated. One wafer was immersed in the buffered oxide etching solution of EXAMPLE 1. The etching, at 25° C., was conducted until the 100 percent etch time, as calculated, was attained. The etched pattern was then rinsed in water. The wafer was then inspected with a light microscope with a magnification in the range of 400× to 1000×. This procedure was repeated exactly with the buffered oxide etching solution of EXAMPLE 2. The results are given in TABLE II below.

Comparative Examples A, B, and C

The procedure of EXAMPLE 13 was repeated exactly with three 4-inch silicon wafers. The patterned wafers were immersed in a buffered oxide etching solution (volume ratio 7:1 of NH4F:HF) which contained no wetting agent for etch times of 100 percent, 105 percent, and 110 percent. The etched wafers were then rinsed in water and inspected using the procedure of EXAMPLE 3. The results are given in TABLE II below.

TABLE II

| Percent of Completely Etched Geometries | | | | |
|---|---|---|---|---|
| Example No. | % of Etch Time | 2 Micron | 1.8 Micron | 1.6 Micron |
| 13 Hexadecylamine Glycidol (5) Adduct | 100 | 100 | 100 | 100 |
| 14 Dodecylamine Glycidol (6) Adduct | 100 | 100 | 100 | 100 |
| Comparative A | 100 | 63 | 51 | 42 |
| Comparative B | 105 | 98 | 95 | 89 |
| Comparative C | 110 | 100 | 100 | 98 |

EXAMPLES 13-14 illustrate that the etching solutions of the present invention etch small geometries completely within the desired etch time without requiring overetching which results in the loss of pattern definition.

What is claimed is:

1. An etching solution comprising an aqueous solution of ammonium fluoride and a wetting amount of a nonionic alkyl amine glycidol adduct.

2. The etching solution of claim 1 in which the ammonium fluoride is present in concentrations of from about 15 to about 40 percent by weight.

3. The etching solution of claim 1 in which the wetting amount of nonionic amine glycidol adduct is from about 5 to about 50,000 parts per million by weight.

4. The etching solution of claim 1 in which hydrogen fluoride is present and the volume ratio of NH4F to HF is from about 3:1 to about 100:1.

5. The etching solution of claim 1 in which the alkyl amine is a secondary amine, a tertiary amine or mixtures thereof.

6. The etching solution of claim 1 in which the nonionic amine glycidol adduct is represented by the formulas:

$$R-N\underset{|}{\overset{Y}{|}}-(CH_2-CH\underset{|}{\overset{OH}{|}}-CH_2O)_nH \quad (I)$$

wherein
R represents an alkyl group having from about 8 to about 18 carbon atoms and mixtures thereof,
Y represents H, $$(CH_2-CH\underset{|}{\overset{OH}{|}}-CH_2O)_mH,$$

or mixtures thereof;
n is from about 1 to about 20; and
m+n are from about 2 to about 20;

wherein

R' and R" represent independently selected alkyl groups, the sum total of carbon atoms in R'+R" being from about 8 to about 18; and x is from 1 to about 20.

7. The etching solution of claim 6 in which the nonionic amine glycidol adduct is represented by the formula:

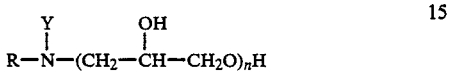

in which R represents an alkyl group having from about 12 to about 16 carbon atoms and mixtures thereof.

8. The etching solution of claim 7 in which m+n are from about 2 to about 16.

9. The etching solution of claim 8 in which the ammonium fluoride is present in concentrations of from about 15 to about 40.

10. The etching solution of claim 9 in which hydrogen fluoride is present and the volume ratio of $NH_4F$ to HF is from about 3:1 to about 100:1.

11. The etching solution of claim 10 in which the wetting amount is from about 25 to about 30,000 parts per million by weight.

12. The etching solution of claim 9 in which R represents cocoamine.

13. The etching solution of claim 6 in which the nonionic amine glycidol adduct is represented by the formula:

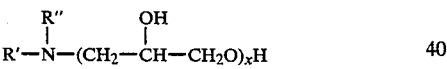

in which x is from about 2 to about 16.

14. The etching solution of claim 13 in which R" represents, for example, methyl, ethyl, or butyl.

15. The etching solution of claim 14 in which the ammonium fluoride is present in concentrations of from about 15 to about 40.

16. The etching solution of claim 15 in which hydrogen fluoride is present and the volume ratio of $NH_4F$ to HF is from about 3:1 to about 100:1.

17. The etching solution of claim 16 in which the wetting amount is from about 25 to about 30,000 parts per million by weight.

18. A process for etching a silicon dioxide coated substrate which comprises immersing the substrate in an aqueous etching solution comprised of ammonium fluoride and a wetting amount of a nonionic alkyl amine glycidol adduct.

19. The process of claim 18 in which the alkyl amine is a secondary amine, a tertiary amine or mixtures thereof.

20. The process of claim 19 in which the ammonium fluoride is present in concentrations of from about 15 to about 40.

21. The process of claim 20 in which hydrogen fluoride is present and the volume ratio of $NH_4F$ to HF is from about 3:1 to about 100:1.

22. The process of claim 21 in which the wetting amount of nonionic alkyl amine glycidol adduct is from about 5 to about 50,000 parts per million by weight.

23. The process of claim 19 in which the nonionic amine glycidol adduct is represented by the formulas:

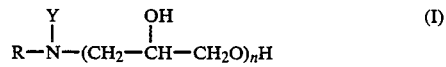

wherein

R represents an alkyl group having from about 8 to about 18 carbon atoms and mixtures thereof, Y represents H,

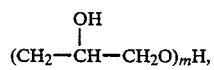

or mixtures thereof;

n is from about 1 to about 20; and m+n are from about 2 to about 20; or

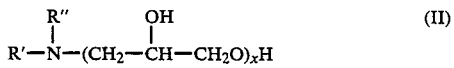

R' and R" represent independently selected alkyl groups, the sum total of carbon atoms in R'+R" being from about 8 to about 18; and x is from 1 to about 20.

24. The process of claim 23 in which R represents an alkyl group having from about 12 to about carbon atoms and mixtures thereof.

25. The process of claim 24 in which m+n are from 2 to about 10.

26. The process of claim 25 in which the ammonium fluoride is present in concentrations of from about 15 to about 40 percent by weight.

27. The process of claim 26 in which hydrogen fluoride is present and the volume ratio of $NH_4F$ to HF is from about 3:1 to about 100:1.

28. The process of claim 23 in which the nonionic amine glycidol adduct is represented by the formula:

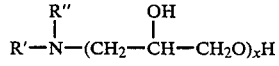

in which x is from about 2 to about 16; and

R" represents methyl, ethyl or butyl.

29. The process of claim 28 in which hydrogen fluoride is present and the volume ratio of $NH_4F$ to HF is from about 3:1 to about 100:1.

* * * * *

UNITED STATES PATENT AND TRADEMARK OFFICE
CERTIFICATE OF CORRECTION

PATENT NO. : 4,863,563

DATED : September 5, 1989

INVENTOR(S) : Michael Scardera and Thomas S. Roche

It is certified that error appears in the above—identified patent and that said Letters Patent is hereby corrected as shown below:

Column 8,
In Claim 24 at line 38, after the word "about" insert the figure --16--.

Signed and Sealed this

Third Day of December, 1991

Attest:

HARRY F. MANBECK, JR.

Attesting Officer      Commissioner of Patents and Trademarks